(12) United States Patent
Park et al.

(10) Patent No.: US 11,177,462 B2
(45) Date of Patent: Nov. 16, 2021

(54) DISPLAY APPARATUS

(71) Applicant: Samsung Display Co., Ltd., Yongin-si (KR)

(72) Inventors: Sunghwan Park, Yongin-si (KR); Joonhee Song, Yongin-si (KR); Taeun Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 89 days.

(21) Appl. No.: 16/671,263

(22) Filed: Nov. 1, 2019

(65) Prior Publication Data

US 2020/0212363 A1 Jul. 2, 2020

(30) Foreign Application Priority Data

Dec. 27, 2018 (KR) .......................... 10-2018-0171134

(51) Int. Cl.
*H01L 51/52* (2006.01)
*G09G 5/10* (2006.01)
*G09G 3/3208* (2016.01)
*H01L 27/32* (2006.01)

(52) U.S. Cl.
CPC ....... *H01L 51/5275* (2013.01); *G09G 3/3208* (2013.01); *G09G 5/10* (2013.01); *H01L 27/326* (2013.01); *H01L 51/524* (2013.01); *H01L 51/5215* (2013.01); *H01L 51/5234* (2013.01)

(58) Field of Classification Search
CPC ............. H01L 51/5275; H01L 51/5234; H01L 51/5215; H01L 51/524; H01L 27/326; G09G 5/10; G09G 3/3208
See application file for complete search history.

(56) References Cited

U.S. PATENT DOCUMENTS

| | | | |
|---|---|---|---|
| 8,080,938 B2 | 12/2011 | Hwang et al. | |
| 8,330,152 B2 | 12/2012 | So | |
| 8,421,342 B2 | 4/2013 | Hong | |
| 8,952,998 B2 | 2/2015 | Gu et al. | |
| 9,223,065 B2 * | 12/2015 | Jung | G02B 27/0006 |

(Continued)

FOREIGN PATENT DOCUMENTS

| | | |
|---|---|---|
| KR | 101097337 B1 | 12/2011 |
| KR | 1020130093328 A | 8/2013 |

(Continued)

*Primary Examiner* — Steven H Loke
*Assistant Examiner* — Juanita B Rhodes
(74) *Attorney, Agent, or Firm* — Cantor Colburn LLP

(57) ABSTRACT

A display apparatus includes a transmission area at which an image of a background behind the display apparatus is visible from a front side thereof; a pixel area at which light is generated and emitted to display an image; a display unit in pixel areas, the display unit in the pixel area including: a light-emitting device which generates and emits the light, and a pixel circuit which is electrically connected to the light-emitting device; and an optical refractive layer through which both the image of the background and the light which is emitted from the pixel area are transmitted to outside the display apparatus. The optical refractive layer defines a plurality of minute holes in planar areas of the pixel area respectively corresponding to the light-emitting device and to a periphery of the light-emitting device.

20 Claims, 12 Drawing Sheets

(56) References Cited

U.S. PATENT DOCUMENTS

| | | | | |
|---|---|---|---|---|
| 2012/0280987 A1* | 11/2012 | Iwane | ............... | G02B 30/27 |
| | | | | 345/419 |
| 2013/0207082 A1 | 8/2013 | Cho et al. | | |
| 2013/0328479 A1* | 12/2013 | Jung | ............ | G02B 27/0006 |
| | | | | 313/504 |
| 2015/0144918 A1* | 5/2015 | Cho | ............ | B29D 11/00788 |
| | | | | 257/40 |
| 2018/0188441 A1 | 7/2018 | Fattal | | |
| 2019/0250439 A1* | 8/2019 | Urey | ............ | G02F 1/136209 |

FOREIGN PATENT DOCUMENTS

| | | |
|---|---|---|
| KR | 1020130139060 A | 12/2013 |
| KR | 101358784 B1 | 1/2014 |
| KR | 101566271 B1 | 10/2015 |
| KR | 101763442 B1 | 7/2017 |
| WO | 2017041072 A1 | 3/2017 |

\* cited by examiner

DISPLAY APPARATUS

This application claims priority to Korean Patent Application No. 10-2018-0171134, filed on Dec. 27, 2018, and all the benefits accruing therefrom under 35 U.S.C. § 119, the disclosure of which is incorporated herein in its entirety by reference.

BACKGROUND

1. Field

One or more embodiments relate to a display apparatus, and more particularly, to a display apparatus in which sufficient transmittance is ensured and resolution is enhanced.

2. Description of the Related Art

Generally, display apparatuses are configured to display an image. As there is an increase in use of mobile electronic devices, the display apparatuses are used in various environments. In the case of a display apparatus equipped in a mobile electronic device, the display apparatus may have transmissibility as needed. Thus, a user may observe a background at the rear of the display apparatus.

SUMMARY

A background at the rear of a transmissible display apparatus, may be viewable through the transmissible display apparatus. However, where transmissibility of light and image through the transmissive display apparatus is relatively low, there are drawbacks such as visibility of the background is poor, visibility of an image which is generated and displayed by the transmissible display apparatus is poor, or the like.

In order to improve visibility of the background behind a transmissive display apparatus and visibility of an image displayed thereby, one or more embodiments include a display apparatus in which sufficient transmittance of light and background image therethrough is ensured and resolution is enhanced. However, the one or more embodiments are only examples, and the scope of the present disclosure is not limited thereto.

Additional features will be set forth in part in the description which follows and, in part, will be apparent from the description, or may be learned by practice of the presented embodiments.

According to one or more embodiments, a display apparatus includes a transmission area at which an image of a background behind the display apparatus is visible from a front side thereof; a pixel area at which light is generated and emitted to display an image of the display apparatus; a display unit in the pixel area, the display unit in the pixel area including: a light-emitting device which generates and emits the light, and a pixel circuit which is electrically connected to the light-emitting device and controls the light-emitting device to generate and emit the light; and an optical refractive layer through which both the image of the background and the light which is emitted from the pixel area are transmitted to outside the display apparatus. The optical refractive layer defines a plurality of minute holes in planar areas of the pixel area respectively corresponding to the light-emitting device and to a periphery of the light-emitting device.

The transmission area may be adjacent to the pixel area along a first direction, and the plurality of minute holes may be arranged in a diagonal line relative to the first direction.

The optical refractive layer may include silicon oxide.

The transmission area may not include a light-emitting device.

The plurality of minute holes may be arranged to have a constant pitch in one direction.

The optical refractive layer may further define a plurality of minute holes corresponding to the transmission area.

The display unit which is supplied with power may display the image in a planar area of the pixel area which corresponds to the light-emitting device, and the plurality of minute holes of the optical refractive layer may replicate the image which is displayed at the planar area which corresponds to the light-emitting device, to define a replicated image, the replicated image being displayed at a planar area of the pixel area which corresponds to the periphery of the light-emitting device.

According to one or more embodiments, a display apparatus includes a plurality of pixels at which light is generated and emitted to display an image of the display apparatus; a plurality of transmission areas at which an image of a background behind the display apparatus is visible from a front side thereof, the plurality of transmission areas alternating with the plurality of pixels; a display unit in the plurality of pixels, the display unit in the pixels including: a light-emitting device which generates and emits the light, and a pixel circuit which is electrically connected to the light-emitting device and controls the light-emitting device to generate and emit the light; and an optical refractive layer through which the light which is emitted from the pixels is transmitted to outside the display apparatus to display the image. The optical refractive layer defines a plurality of minute holes in planar areas corresponding to each of the plurality of pixels and peripheries of the plurality of pixels.

The plurality of pixels may be arranged in a first direction or in a second direction which crosses the first direction, and the plurality of minute holes may be arranged in a diagonal direction crossing the first direction and the second direction.

The optical refractive layer may include silicon oxide.

Each of the plurality of transmission areas may not include a light-emitting device.

The plurality of minute holes may be arranged to have a constant pitch in one direction.

The optical refractive layer may further define a plurality of minute holes in the plurality of transmission areas.

The display unit which is supplied with power may display the image at the plurality of pixels, and the plurality of minute holes of the optical refractive layer may replicate the image which is displayed at the plurality of pixels, to define a replicated image, the replicated image being displayed at the peripheries of the plurality of pixels.

In addition to those described above, other features and effects will become apparent from the following drawings, claims, and detailed descriptions of the present disclosure.

BRIEF DESCRIPTION OF THE DRAWINGS

These and/or other features will become apparent and more readily appreciated from the following description of the embodiments, taken in conjunction with the accompanying drawings in which.

DETAILED DESCRIPTION

Figure 1:
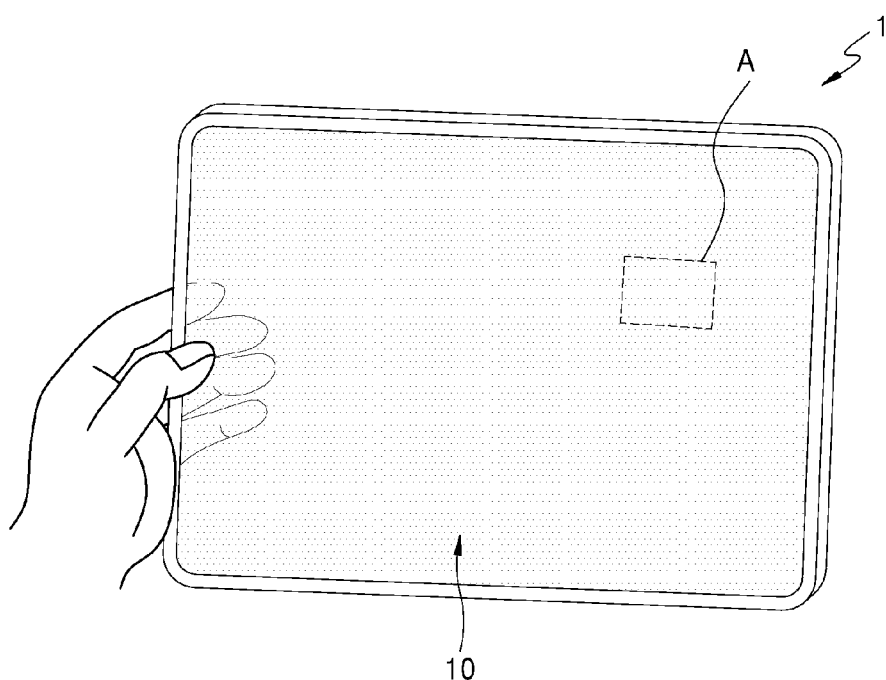
FIG. 1 is a schematic perspective view of an embodiment of a display apparatus.

Reference will now be made in detail to embodiments, examples of which are illustrated in the accompanying drawings, where like reference numerals refer to like elements throughout. In this regard, the present embodiments may have different forms and should not be construed as being limited to the descriptions set forth herein. Accordingly, the embodiments are merely described below, by referring to the figures, to explain features of the present description.

The singular forms "a," "an" and "the" are intended to include the plural forms as well, unless the context clearly indicates otherwise. As used herein, the term "and/or" includes any and all combinations of one or more of the associated listed items. Expressions such as "at least one of," when preceding a list of elements, modify the entire list of elements and do not modify the individual elements of the list.

As the present disclosure allows for various changes and numerous embodiments, particular embodiments will be illustrated in the drawings and described in detail in the written description. Effects and features of the present disclosure and a method of achieving the same will become apparent to those skilled in the art from the following detailed description which discloses various embodiments in conjunction with the annexed drawings. The present disclosure may, however, be embodied in many different forms and should not be construed as being limited to the embodiments set forth herein.

Hereinafter, embodiments will be described in detail with reference to the attached drawings. Like reference numerals in the drawings denote like elements, and thus their descriptions will not be repeated.

It will be understood that although the terms "first," "second," etc. may be used herein to describe various components, these components should not be limited by these terms. These components are only used to distinguish one component from another.

It will be further understood that the terms "comprises" and/or "comprising" used herein specify the presence of stated features or components, but do not preclude the presence or addition of one or more other features or components.

It will be understood that when a layer, region, or component is referred to as being related to another element such as being "on," another layer, region, or component, it can be directly or indirectly on the other layer, region, or component. That is, for example, intervening layers, regions, or components may be present. In contrast, when a layer, region, or component is referred to as being related to another element such as being "directly on," another layer, region, or component, no intervening layers, regions, or components are present.

Sizes of elements in the drawings may be exaggerated for convenience of explanation. In other words, since sizes and thicknesses of components in the drawings are arbitrarily illustrated for convenience of explanation, the following embodiments are not limited thereto.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When a certain embodiment may be implemented differently, a specific process order may be performed differently from the described order. For example, two consecutively described processes may be performed substantially at the same time or performed in an order opposite to the described order.

According to one or more embodiment, a display apparatus is an electronic apparatus which displays an image. The display apparatus may be a liquid-crystal display apparatus, an electrophoretic display apparatus, an organic light-emitting display apparatus, an inorganic electroluminescence ("EL") display apparatus, a field-emission display apparatus, a surface-conduction electron-emitter display apparatus, a plasma display apparatus, a cathode ray tube display apparatus, or the like.

Hereinafter, as an example of a display apparatus, an organic light-emitting display apparatus is described. However, a display apparatus in the present disclosure is not limited thereto and may be any one or various types of display apparatus.

Figure 2:
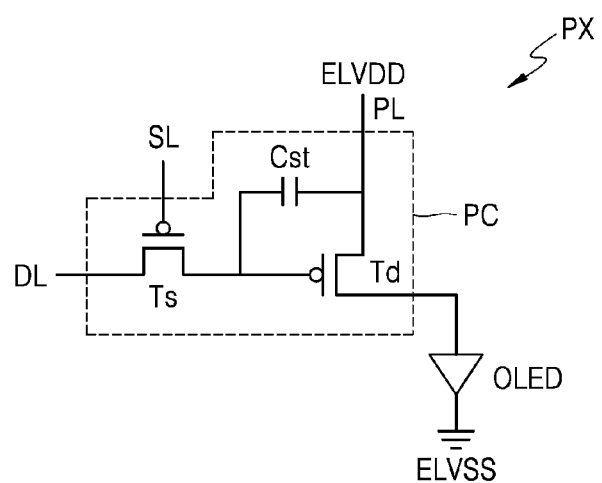
FIG. 2 is an equivalent circuit diagram of an embodiment of a pixel of a display apparatus.

FIG. 1 is a schematic perspective view of an embodiment of a display apparatus 1. FIG. 2 is an equivalent circuit diagram of an embodiment of a pixel of the display apparatus 1.

In FIG. 1, the display apparatus 1 is a transparent (transmissible) display apparatus having transmissivity. As a transparent (transmissible) display apparatus, when electrical power is not supplied to the display apparatus 1, the display apparatus 1 provides a transparent or translucent state thereof like that of glass. When electrical power is supplied to the display apparatus 1, an image is displayed on a portion of an area of a display panel 10 of the display apparatus 1, such as to be viewable from outside the display apparatus 1. Even when power is supplied to the display apparatus 1, a portion of the display apparatus 1 in which an image is not displayed, still provides a transparent or translucent state. As such, the display apparatus 1 is implemented so that not only an image rendered by the display apparatus 1, but also a background or environment which is external to the display apparatus 1, is viewable through the display apparatus 1.

The display apparatus 1 includes a display panel 10 configured to generate and/or display an image. The display panel 10 includes a pixel PX (shown in FIG. 2) provided in plurality which may be hereinafter referred to as pixels PX or a plurality of pixels PX. The pixels PX may include a pixel circuit PC (shown in FIG. 2) and a display element which is connected to the pixel circuit PC, for example, an organic light-emitting diode OLED (shown in FIG. 2). The pixel circuit PC may drive and/or control the display element to generate and/or display an image. The pixel circuit PC includes a switching element such as a thin-film transistor electrically connected to other features within the pixel circuit PC such as a signal line and power line, a storage capacitor, etc. That is, the display element may be driven or controlled by using electrical signals, power signals, etc. provided via features of the pixel circuit PC such as the switching element, the signal line, the power lines, the storage capacitor, etc.

The pixels PX may emit red, green, blue and/or white light via the organic light-emitting diode OLED for displaying an image. Herein, a pixel PX may be understood as a pixel PX configured to emit light of a color among red, green, blue, and white, as described above. Although not illustrated, the display panel 10 may be covered by a sealer which bonds an upper substrate of the display panel 10 to a lower substrate thereof to be thereby protected from external air, moisture, or the like. When the display element in the pixel PX is an organic light-emitting diode OLED, the thin-film transistor may include at least a driving thin-film transistor and a switching thin-film transistor.

Referring to FIG. 2, a pixel PX includes the pixel circuit PC and a display element which is connected to the pixel circuit PC. FIG. 2 shows the organic light-emitting diode OLED as the display element. The pixel circuit PC may include a first thin-film transistor Td, a second thin-film transistor Ts, and a storage capacitor Cst.

The second thin-film transistor Ts is a switching thin-film transistor and is connected to a scan line SL and a data line DL. According to a switching voltage input from the scan line SL, the second thin-film transistor Ts transmits a data voltage to the first thin-film transistor Td when the data voltage is input from the data line DL. The storage capacitor Cst is connected to the second thin-film transistor Ts and a driving voltage line PL. The storage capacitor Cst stores a voltage corresponding to a difference between a voltage transmitted from the second thin-film transistor Ts and a first power voltage ELVDD supplied to the driving voltage line PL.

The first thin-film transistor Td is a driving thin-film transistor and connected to the driving voltage line PL and the storage capacitor Cst. The first thin-film transistor Td may control driving electrical current flowing from the driving voltage line PL to the organic light-emitting diode OLED in correspondence with a value of the voltage stored in the storage capacitor Cst. The organic light-emitting diode OLED may emit light having certain brightness according to the driving current. An opposite electrode (e.g., a cathode) of the organic light-emitting diode OLED may receive a second power voltage ELVSS.

It is described with reference to FIG. 2 that the pixel circuit PC includes two thin-film transistors and a storage capacitor. However, the present disclosure is not limited thereto. The number of thin-film transistors and the number of storage capacitors may be variously modified according to a design of the pixel circuit PC.

Figure 3:
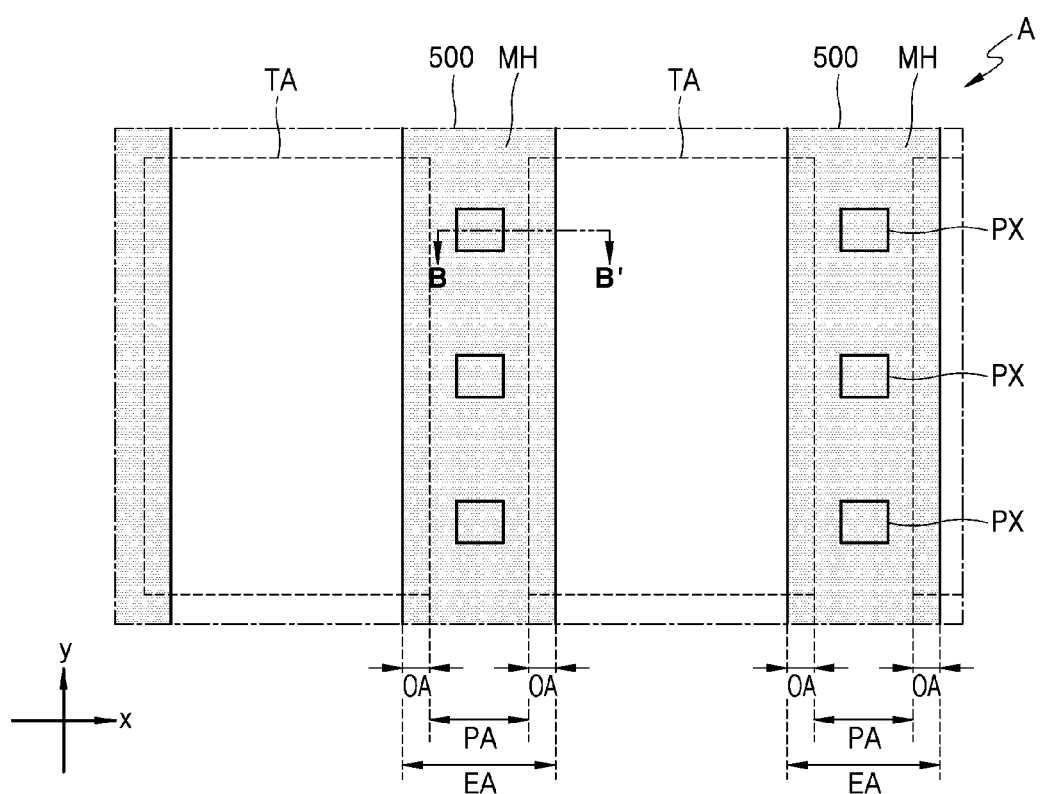
FIG. 3 is an enlarged top plan view of an embodiment of region A of the display apparatus of FIG. 1.
Figure 4:
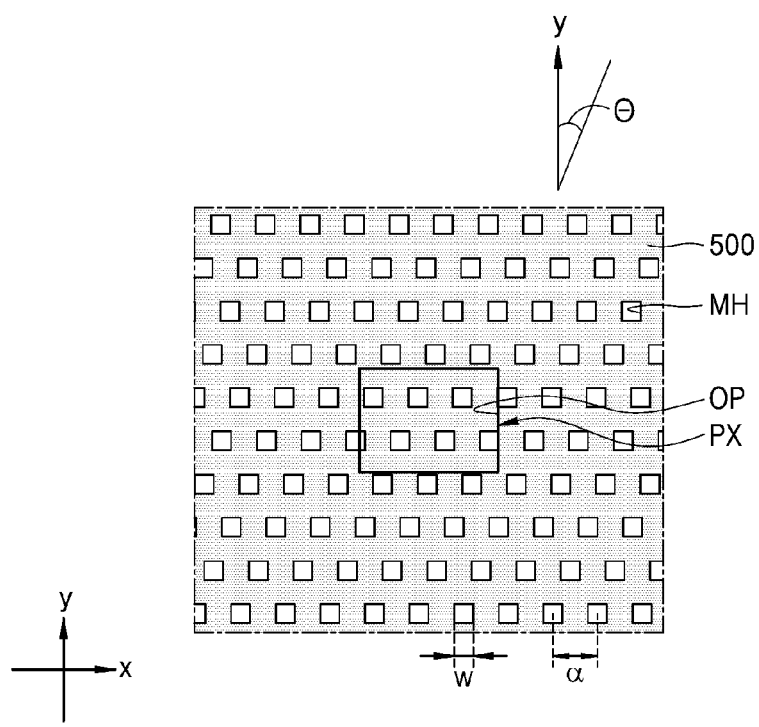
FIG. 4 is an enlarged top plan view of an embodiment of a portion of the region A corresponding to a pixel and a periphery of the pixel of the display apparatus 1 of FIG. 3.
Figure 5:
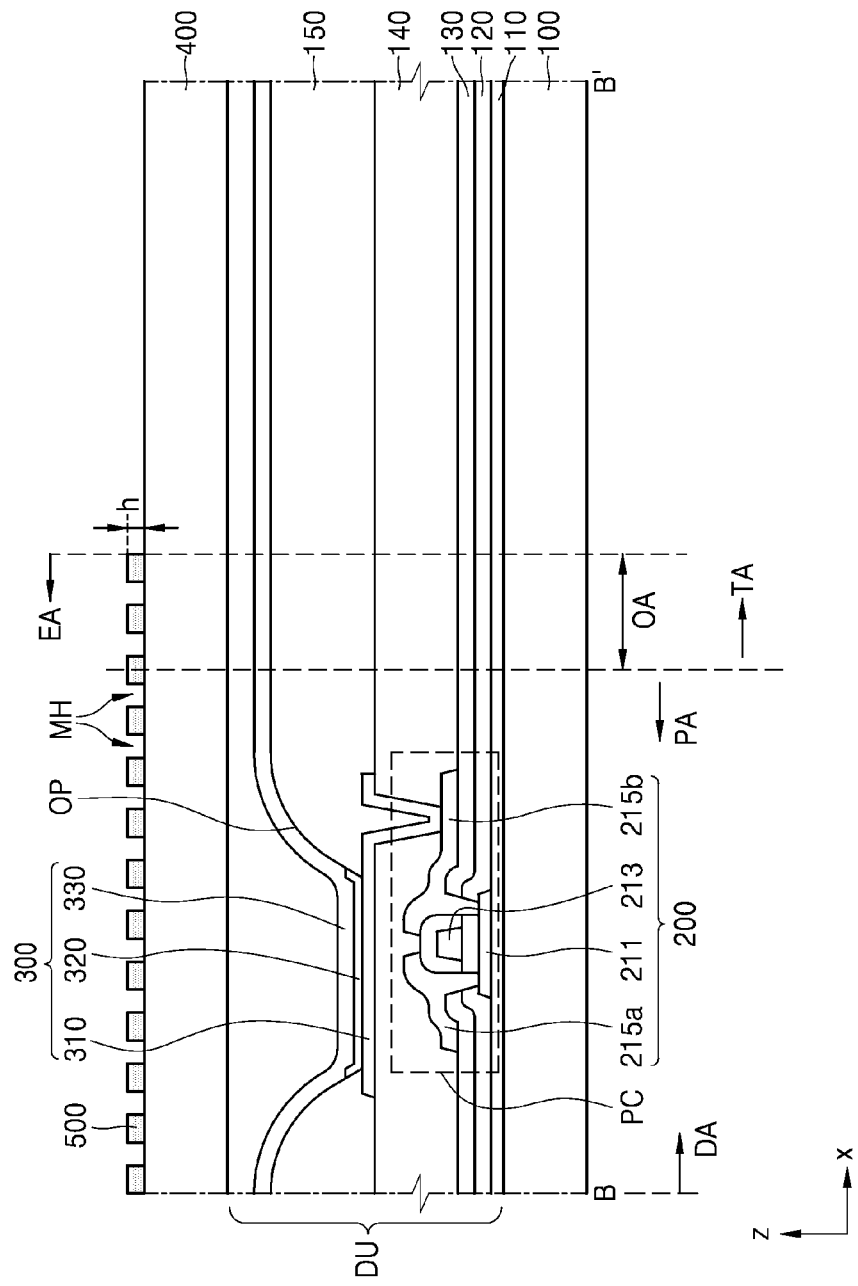
FIG. 5 is a cross-sectional view of the display apparatus taken along line B-B' of FIG. 3.

FIG. 3 is an enlarged top plan view of an embodiment of region A of the display apparatus 1 of FIG. 1. FIG. 4 is an enlarged top plan view of an embodiment of a portion of the region A corresponding to a pixel PX and a periphery of the pixel PX of the display apparatus 1 of FIG. 3. FIG. 5 is a cross-sectional view of the display apparatus 1 taken along line B-B' of FIG. 3.

Referring to FIGS. 3 to 5, the display apparatus 1 includes a lower substrate 100, a display unit DU on the lower substrate 100, an upper substrate 400 facing the lower substrate 100 with the display unit DU therebetween, and an optical refractive layer 500 provided in plurality on the upper substrate 400 which may be hereinafter referred to as optical refractive layers 500 or a plurality of optical refractive layers 500.

Referring to FIG. 5, the lower substrate 100 may include various materials such as a glass material, a metal material, a plastic material such as polyethylene terephthalate ("PET"), polyethylene naphthalate ("PEN"), polyimide, etc. FIG. 5 the display apparatus 1 as a relatively rigid-type of display apparatus 1. However, according to an embodiment, the display apparatus 1 may be implemented as a flexible-type of display apparatus.

The lower substrate 100 includes a display area DA at which an image is displayed and a peripheral area (not shown) which is outside the display area DA. Referring to FIG. 1, region A is disposed in the display area DA of the display apparatus 1. The display area DA includes a pixel area PA provided in plurality which may be hereinafter referred to as pixel areas PA or a plurality of pixel areas PA and a transmission area TA provided in plurality which may be hereinafter referred to as transmission areas TA or a plurality of transmission areas TA. The transmission area TA is an area at which an image of a background behind the display apparatus 1 is visible from a front side thereof. The pixel area PA is an area at which light is emitted to display an image of the display apparatus 1. The transmission areas TA may be alternating with the pixel areas PA.

A pixel area PA may include the pixel circuit PC, a light-emitting device 300 electrically connected to the pixel circuit PC, and one or more wire connecting the pixel circuit PC to the light-emitting device 300. The pixel circuit PC includes the structure shown in FIG. 2. However, for convenience of illustration, FIG. 5 shows only a thin-film transistor 200. Features or devices within the display area DA may hinder or degrade transmissibility of light at the display area DA. For example, such features or devices may block or reflect light, such that the display area DA may not be considered as transparent or translucent area through which light is transmittable for defining a display apparatus 1 which is designated as transmissible.

The transmission areas TA are remaining areas of the display area DA other than the pixel areas PA thereof. The transmission areas TA refer to planar areas in which the pixel circuit PC, the light-emitting device 300 and the wires are not arranged (e.g., are absent or excluded). That is, no pixel circuit PC, no light-emitting device 300 and no wire may be disposed in any of the transmission areas TA. The transmission areas TA refer to planar areas which are transparent or translucent such that light is transmittable therethrough. Features or devices that may hinder or degrade transmissibility such as by blocking light, need to be limitedly arranged in the transmission areas TA. Layers stacked in the transmission areas TA, along a thickness direction of the display apparatus 1, may also include transparent or translucent materials through which light is transmittable. As such, as the display area DA includes both the pixel areas PA and the transmission areas TA in the display panel 10 of FIG. 1, not only an image rendered by the display apparatus 1 is viewable from outside the display apparatus 1, but also an image of a background or environment external to the display apparatus 1 is viewable at a front side or viewing side thereof.

The display unit DU is arranged on the lower substrate 100. On the lower substrate 100, a buffer layer 110 including an inorganic material such as silicon oxide, silicon nitride, and/or silicon oxynitride may be arranged. The buffer layer 110 may increase smoothness of an upper surface of the lower substrate 100 or prevent or greatly reduce penetration of impurities from the lower substrate 100, etc. into the thin-film transistor 200.

On the buffer layer 110, the thin-film transistor 200 may be arranged. The thin-film transistor 200 may include a semiconductor layer 211, a gate electrode 213, a source electrode 215a, and a drain electrode 215b. The semiconductor layer 211 may include amorphous silicon, polycrystalline silicon, or an organic semiconductor material.

A gate insulating layer 120 may be arranged between the semiconductor layer 211 and the gate electrode 213 to insulate these features from each other. The gate insulating layer 120 includes an inorganic material such as silicon oxide, silicon nitride, and/or silicon oxynitride.

In addition, on the gate electrode 213, an interlayer insulating layer 130 may be arranged. The interlayer insulating layer 130 includes an inorganic material such as silicon oxide, silicon nitride, and/or silicon oxynitride. The source electrode 215a and the drain electrode 215b may be arranged on the interlayer insulating layer 130.

A first insulating layer 140 may be arranged on the thin-film transistor 200. As shown in FIG. 5, for example, when the light-emitting device 300 that is an organic light-emitting diode is arranged on the thin-film transistor 200, the first insulating layer 140 may planarize an upper surface of a protective layer covering the thin-film transistor 200. The first insulating layer 140 may include, for example, an organic material such as acryl, benzocyclobutene ("BCB"), hexamethyldisiloxane ("HMDSO"), etc.

On the first insulating layer 140, the organic light-emitting device 300 may be arranged. The organic light-emitting device 300 includes a pixel electrode 310, an opposite electrode 330, and an intermediate layer 320 arranged therebetween and including an emission layer. As shown in FIG. 5, the pixel electrode 310 contacts one of the source electrode 215a and the drain electrode 215b at a contact hole in the first insulating layer 140, etc. to be thereby electrically connected to the thin-film transistor 200.

On the first insulating layer 140, a second insulating layer 150 may be arranged. The second insulating layer 150 defines or provides an opening OP corresponding to a portion of the pixel electrode 310, such as a central portion thereof, to thereby define a pixel PX. In addition, the second insulating layer 150 on the pixel electrode 310 increases a distance between an edge of the pixel electrode 310 and the opposite electrode 330 which is disposed over the pixel electrode 310 to thereby reduce or effectively prevent generation of an electrical arc, etc. at the edge of the pixel electrode 310. The second insulating layer 150 may include, for example, an organic material such as polyimide, HMDSO, or the like.

The intermediate layer 320 of the organic light-emitting device 300 may include a relatively low-molecular weight material or a polymer material. When the intermediate layer 320 includes a relatively low-molecular weight material, the intermediate layer 320 may include a single-layered or multi-layered structure in which a hole injection layer ("HIL"), a hole transport layer ("HTL"), an emission layer ("EML"), an electron transport layer ("ETL"), an electron injection layer ("EIL"), etc. are stacked. The intermediate layer 320 may include various organic materials such as copper phthalocyanine (CuPc), N, N''-di(naphthalene-1-yl)-N, N''-diphenyl-benzidine ("NPB"), tris-8-hydroxyquinoline aluminum (Alq3), etc. In an embodiment of manufacturing a display apparatus 1, such layers may be formed by using a vacuum deposition method.

When the intermediate layer 320 includes a polymer material, the intermediate layer 320 may generally have a structure including an HTL and an EML. In this case, the HTL may include poly(3,4-ethylene dioxythiophene) ("PEDOT"), and the EML may include a polymer material such as poly(phenylenevinylene) ("PPV"), polyfluorene, or the like. In an embodiment of manufacturing a display apparatus 1, the intermediate layer 320 may be provided or formed by using a screen printing method, an inkjet printing method, a laser-induced thermal imaging ("LITI") method, or the like.

The intermediate layer 320 may include a layer commonly arranged over a pixel electrode 310 arranged in plurality or a layer discretely patterned in correspondence with each of a pixel electrode 310 arranged in plurality.

The opposite electrode 330 may be arranged in an upper portion of the display area DA along a thickness direction of the display apparatus 1 and over a whole surface of the display area DA. The opposite electrode 330 may be arranged commonly in the display area DA to thereby correspond to each of a pixel electrode 310 arranged in plurality within the display area DA.

Since the organic light-emitting device 300 may be easily damaged by external moisture, oxygen, or the like, the upper substrate 400 is arranged over the organic light-emitting device 300 to thereby protect the organic light-emitting device 300. Although not illustrated, in a peripheral area of the lower substrate 100 adjacent to the display area DA thereof, the lower substrate 100 may be bonded to the upper substrate 400. A sealer (not shown) configured to seal the display unit DU from the outside may be arranged in the peripheral area.

The optical refractive layers 500 may be arranged on the upper substrate 400. According to an embodiment, the display apparatus 1 is a top-emission type apparatus in which light is emitted toward the upper substrate 400. Accordingly, the optical refractive layers 500 may be arranged on the upper substrate 400 in a direction toward which light is emitted. As another embodiment, when a display apparatus 1 is a bottom-emission type apparatus, an optical refractive layer 500 may be arranged on a lower substrate 100. In the present embodiment, the optical refractive layers 500 may be arranged to respectively correspond to the pixel areas PA at which the pixels PX are provided. At least some of the optical refractive layers 500 may overlap the transmission areas TA. The optical refractive layers 500 may include, for example, a material having predetermined transmissibility or greater such as silicon oxide ($SiO_2$).

The optical refractive layers 500 may include a minute hole MH provided in plurality which may be hereinafter referred to as minute holes MH or a plurality of minute holes MH. The minute holes MH within a single one of the optical refractive layers 500 may be separated from each other by solid portions thereof, such as to form a mesh-like structure. In the present embodiment, the minute holes MH are provided or arranged in all of the optical refractive layers 500. However, as another embodiment, the minute holes MH may be provided or arranged in only some of the optical refractive layers 500.

When light is emitted from the organic light-emitting device 300, the light is emitted toward the outside of the display apparatus 1 and through the optical refractive layers 500. As the light is refracted (e.g., diffracted) via the minute holes MH, images of the pixels PX may appear to be provided at peripheries of the organic light-emitting device 300. This refers to a phenomenon in which, when light is emitted from a pixel PX, as a diffraction phenomenon occurs due to a certain pattern in the optical refractive layers 500 according to pixel replication, lights or images which are identical to those provided by the pixel X are visible at a periphery of the pixel X. These lights or images which are identical to those provided by the pixel X and which are replicated at the replicated pixels may be referred to as a replicated image. Such replicated pixels at the peripheries of the pixel PX do not actually include a light-emitting device 300, such that the image formed by such replicated pixels are visible according to a diffraction phenomenon of light which is actually provided from the light-emitting device 300.

Referring to FIG. 3, the plurality of pixels PX are arranged in the pixel areas PA, and the transmission areas TA are arranged between the pixel areas PA. Here, a pixel PX includes the light-emitting device 300 (shown in FIG. 5) that actually emits light. The pixels PX may be defined corresponding to the opening OP (shown in FIG. 4) in the second insulating layer 150. The plurality of pixels PX may emit light of a same color or light of different colors. The plurality of pixels PX may, for example, emit light of one of red, green, blue, and white.

The plurality of pixels PX within an optical refractive layer 500 are arranged in the y-axis direction, and may be referred to as a group of the pixels PX. A single one of the transmission areas TA is provided between two groups of the pixels PX. As shown in FIG. 5, in the transmission area TA, only insulating layers, that is, the buffer layer 110, the gate insulating layer 120, the interlayer insulating layer 130, the first insulating layer 140, and the second insulating layer 150, are arranged, and a light-emitting device 300, a pixel circuit PC, and wires that may each deteriorate transmissibility of light are not arranged. The opposite electrode 330 is arranged over a whole surface of the display area DA, and thus, may be extended from the display area DA to also be arranged in the transmission areas TA. The opposite electrode 330 includes a conductive layer having light transmissibility.

In the pixel areas PA shown in FIG. 3, the optical refractive layers 500 have a striped shape, defined by a length along the y-axis direction and a width along the x-axis direction. The optical refractive layers 500 are arranged to correspond to the plurality of pixels PX as a group thereof. Like the plurality of pixels PX, the optical refractive layers 500 may be arranged in the y-axis direction.

Referring to FIG. 3, an optical refractive layer 500 may have a continuous length along the y-axis direction which corresponds to multiple or all of groups of the pixels PX corresponding to the optical refractive layer 500 along the y-axis direction, and may have a discrete width along the x-axis direction which corresponds to the groups of the pixels PX arranged along the y-axis direction. However, the present disclosure is not limited thereto.

Referring to FIG. 3, in whole areas of the optical refractive layers 500, the minute holes MH may be arranged spaced apart from each other by solid portions of the optical refractive layers 500. In the transmission areas TA, the optical refractive layers 500 are absent or excluded. In an embodiment, the optical refractive layers 500 may be considered as defining an opening therein corresponding to the transmission areas TA, at which there are no solid portions and no minute holes MH provided. The minute holes MH may be arranged along a direction of a row and along a direction of a column. As an embodiment, the direction of a row may be the x-axis direction, and the direction of a column may be a diagonal direction inclined with respect to the y-axis direction. An angle θ with respect to the y-axis direction may be, for example, about 10 degrees)(°) to about 20°. However, this is only an example. According to a design of the number, a size, and/or a location of the replicated pixels relative to pixels PX, the angle θ at which the minute holes MH may be arranged may be modified.

In addition, referring to FIG. 4 showing an enlarged top plan view of an optical refractive layer 500 of FIG. 3, the minute holes MH may be arranged in a diagonal line. The arranging of the minute holes MH in a diagonal line may indicate that the minute holes MH are arranged along a line which is inclined at a predetermined angle θ with respect to the y-axis direction in a top plan view. Widths w of the minute holes MH may be, for example, about 3 micrometers (μm) to about 4 μm. A period α of the minute holes MH may be about 5 μm to about 6 μm. However, this is only an example. According to a design of the number, a size, and/or a location of the replicated pixels relative to pixels PX, the widths w and the period α of each of the minute holes MH may be modified. While the width w and the period α are shown taken along the x-axis direction, these dimensions may also be taken along the y-axis direction or a direction inclined with respect to the x-axis direction and/or the y-axis direction. The width w may be a maximum dimension of a minute hole MH along a particular direction, but is not limited thereto. The period α may be taken between centers of minute holes MH which are directly adjacent to each other, but is not limited thereto.

FIG. 4 shows that the minute holes MH have a rectilinear shape such as a rectangular shape. However, the present disclosure is not limited thereto. Since the minute holes MH have planar dimensions several micrometers, actually implementing the minute holes MH in an exact rectilinear shape such as the rectangular shape may be difficult. Accordingly, the minute holes MH may have various planar shapes such as a circular shape or a near-circular polygonal shape. A planar shape of the minute holes MH may also be modified according to a design of the number, a size, or a location of the replicated pixels relative to the pixels PX.

Figure 6:
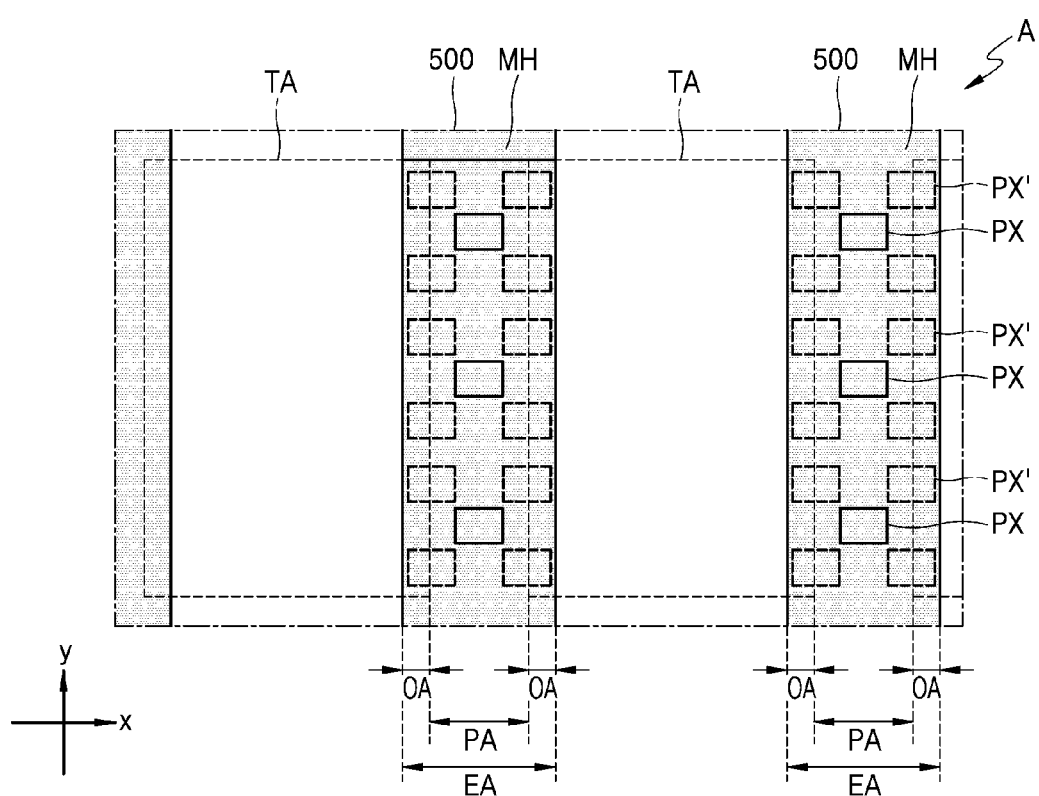
FIG. 6 is a top plan view of an embodiment of operation of the display apparatus of FIG. 3.
Figure 7:
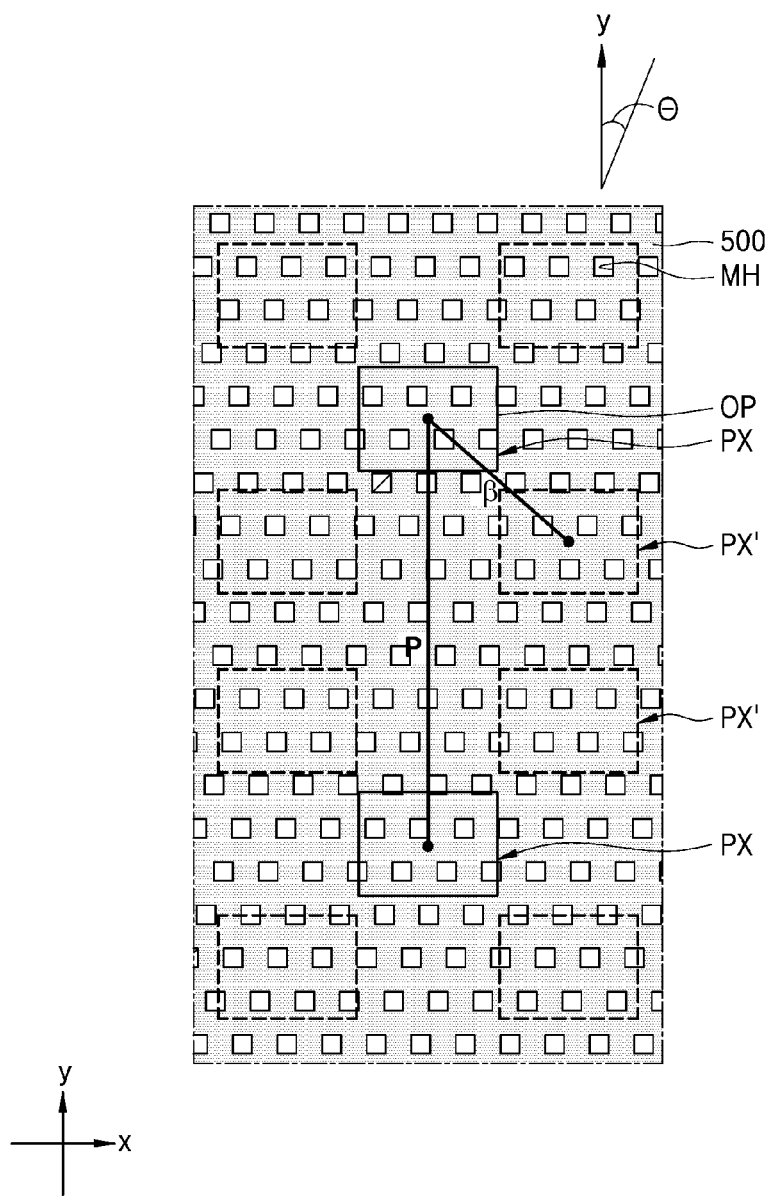
FIG. 7 is an enlarged top plan view of a portion of pixels and a periphery of the pixels of the display apparatus of FIG. 6.

FIG. 6 is a top plan view illustrating an embodiment of operation of the display apparatus 1 of FIG. 3. FIG. 7 is an enlarged top plan view of a portion of pixels and a periphery of the pixels of the display apparatus 1 of FIG. 6.

In an embodiment, the display unit DU which is supplied with power displays an image in a planar area of the pixel area PA which corresponds to the light-emitting device 300 (e.g., at pixel PX in FIG. 6). The plurality of minute holes MH of the optical refractive layer 500 replicates the image which is displayed at the planar area which corresponds to the light-emitting device 300, to define a replicated image, where the replicated image is displayed or visible at a planar area of the pixel area PA which corresponds to the periphery of the light-emitting device 300 (e.g., around pixel PX in FIG. 6).

Referring to FIG. 6, a structure in which the minute holes MH are arranged is designed to form a replicated pixel PX' provided in plurality which may be hereinafter referred to replicated pixels PX' or a plurality of replicated pixels PX', by diffracting light emitted from a pixel PX. The replicated pixels PX' corresponding to a pixel PX from which light is emitted, may appear (e.g., be visible) at a periphery of the pixel PX. In FIG. 6, a total of 4 replicated pixels PX' appear at a periphery of the pixel PX and disposed along a diagonal direction relative to the pixel PX. However, a location or the number of replicated pixels PX' relative to the pixel PX may be modified according to a design of the minute holes MH.

$$\beta = z_{EN} \tan\left[\sin^{-1}\left(\frac{\lambda}{a} \times \frac{1}{n_{EN}}\right)\right] \quad \text{Equation 1}$$

As shown in Equation 1, a distance β between a pixel PX which actually emits light and replicated pixels PX' may be defined according to a period α of the minute holes MH, a thickness $z_{EN}$ of the upper substrate 400, and a refractive index $n_{EN}$ of the upper substrate 400.

Referring to FIGS. 4 and 7 together, a total of four replicated pixels PX' are implemented at the upper left, the upper right, the lower left, and the lower right positions in a diagonal direction with reference to the pixel PX is shown. As design elements for implementing the replicated pixels PX', for example, the period α (shown in FIG. 4) of the minute holes MH, a width w of the plurality of minute holes MH (shown in FIG. 4), a height (or depth) h of the minute holes MH (shown in FIG. 5 as also corresponding to a thickness of the solid portion of the optical refractive layer 500), etc. may be taken into account. The period α of the minute holes MH may control the distance β (shown in FIG. 7) between the pixel PX which actually emits light and the replicated pixels PX' implemented therefrom. The width w of the minute holes MH or the height h of the minute holes MH may control the intensity in which the replicated pixels PX' appear, for example, brightness, a resolution, etc. of the replicated pixels PX'. The height h may be taken along the z-axis direction. A thickness of the display apparatus 1 and/or components thereof may be defined along the z-axis direction.

As an embodiment, when the period α of the minute holes MH is about 5 μm, a pitch P (shown in FIG. 7) between the pixels PX which actually emit light and are adjacent to each other is about 65 μm. In this case, the distance β between a pixel PX which actually emits light and replicated pixels PX' implemented therefrom may be about 23 μm. In an embodiment, the plurality of minute holes MH are arranged to have a constant pitch in one direction, without being limited thereto.

In an embodiment in which the replicated pixels PX' appear as shown in FIG. 6, an angle at which the minute holes MH are arranged may be, for example, about 10° to about 20°. In addition, each of the minute holes MH has a width w of about 3 μm to about 4 μm, and a pitch P between the minute holes MH may be about 5 μm to about 6 μm. However, this is only an example. According to a design of the number, a size, or a location of the replicated pixels PX' relative to the pixel PX corresponding thereto and which actually emits light, the dimensions, shape, etc. of the minute holes MH may be modified.

The optical refractive layers 500 may be arranged so that a partial planar area of the optical refractive layers 500 overlap the transmission areas TA. Planar areas of the optical refractive layer 500 and a transmission area TA adjacent thereto, which overlap each other, define an overlapping area OA. The overlapping area OA may be provided in plurality which may be hereinafter referred to as overlapping areas OA or a plurality of overlapping areas OA.

Referring to FIG. 3, where the optical refractive layers 500 overlap the transmission areas TA, light-emitting areas EA may be extended to be disposed inside a boundary of the transmission areas TA, to include areas of the optical refractive layer 500 at which the pixels PX are not arranged. That is, the optical refractive layer 500 terminates inside the boundary of the transmission areas TA, to dispose an edge of the optical refractive layer 500 at an inner area of the transmission areas TA. Among a planar area of the light-emitting areas EA, the pixel areas PA may be defined as planar areas in which the pixels PX arranged. The light-emitting areas EA may be defined as total planar areas in which, when the pixels PX emit light, both images of the pixels PX and the replicated pixels PX' appear or are visible.

As shown in FIG. 6, where the optical refractive layers 500 are arranged to overlap the transmission areas TA, the replicated pixels PX' appear in the overlapping areas OA. Thus, light may appear to be emitted in a larger planar area (e.g., the light-emitting area EA) than a planar area corresponding to pixel areas PA at which light is actually emitted from the pixels PX. That is, even though planar areas in which light may be actually emitted correspond to areas in which the pixels PX are arranged, as light diffracted via the optical refractive layers 500 appear as the replicated pixels PX', a light-emitting area EA may be extended to planar areas which are spaced apart from the pixels PX and in which the replicated pixels PX' are located.

In one or more embodiment, the display apparatus 1 may include the pixel areas PA having smaller planar areas to which light emitted from the pixels PX actually extends as compared to planar areas at which the emitted light is visible in the form of the replicated pixels PX'. Accordingly, the display apparatus 1 includes a structure in which light-emitting areas EA providing visible light have a same size as that of a conventional display apparatus, but the pixel areas PA at which light is actually emitted are greatly reduced so that a size of the transmission areas TA is relatively enlarged compared to that of the conventional transparent display apparatus. Thus, the transmissibility of the display apparatus 1 may be enhanced as a transparent display apparatus.

Figure 8:
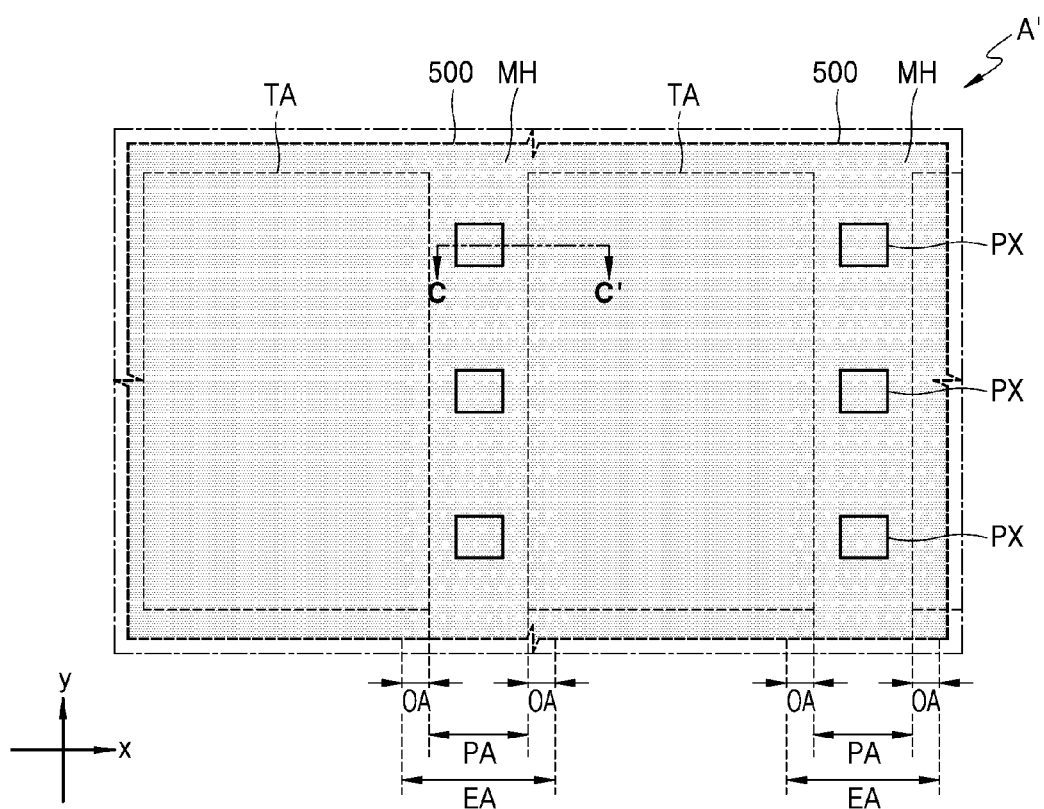
FIG. 8 is an enlarged top plan view of another embodiment of a region of a display apparatus.
Figure 9:
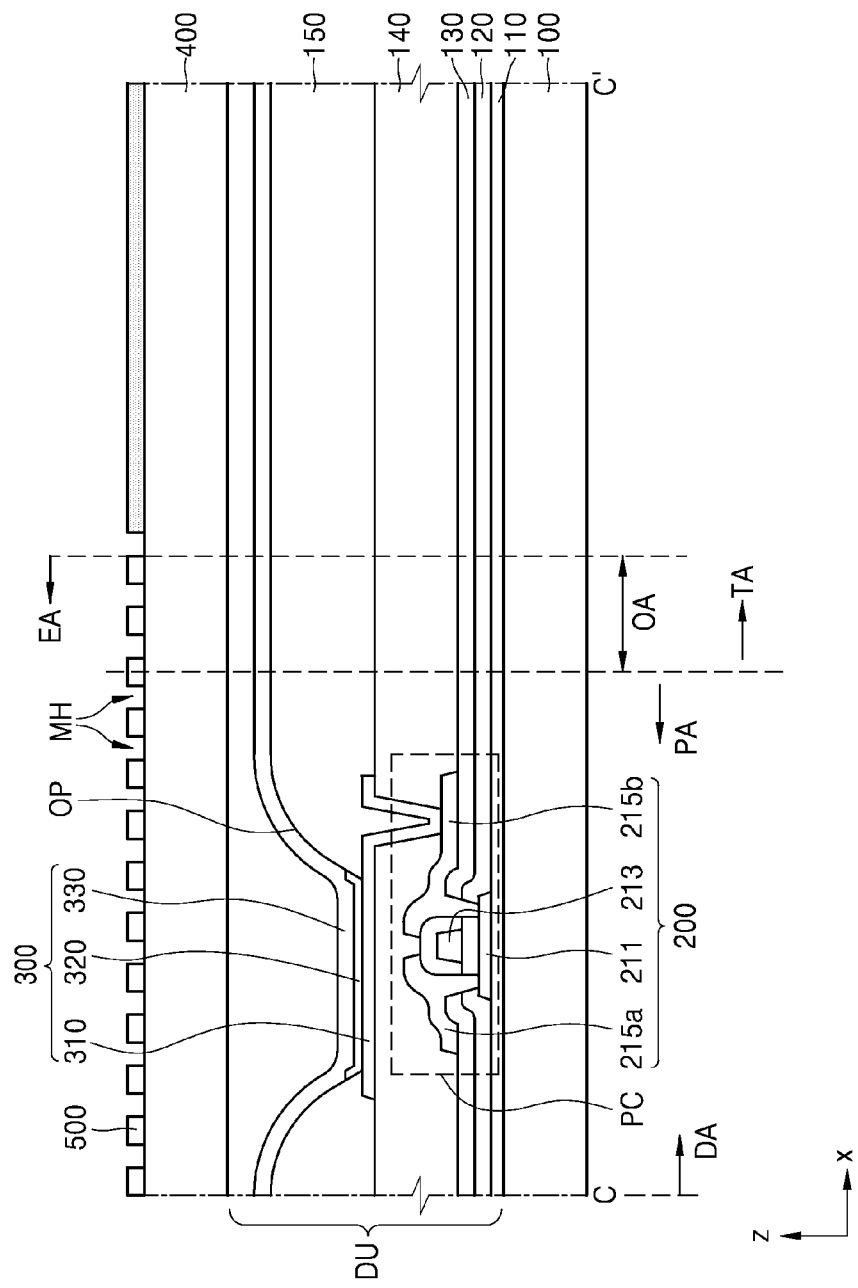
FIG. 9 is a cross-sectional view of the display apparatus taken along line C-C' of FIG. 8.

FIG. 8 is a top plan view of another embodiment of a region A' of a display apparatus. FIG. 9 is a cross-sectional view of the display apparatus taken along line C-C' of FIG. 8.

The display apparatus in FIGS. 8 and 9 is different from that in the above-described embodiments with respect to a shape of the optical refractive layers 500. Components other than the optical refractive layers 500 are the same as those in the above-described embodiment. Thus, hereinafter, a difference between the display apparatus in FIGS. 8 and 9 and the display apparatus 1 in the above-described embodiment is described. A description of the components in FIGS. 8 and 9 same as those in the above-described embodiment is referred to the above-described embodiment.

The optical refractive layers 500 may be arranged to respectively correspond to a whole surface of the display area DA. The optical refractive layers 500 disposed in the—light emitting areas EA may extend therefrom to also be arranged in the transmission areas TA of the display area DA. Referring to FIGS. 8 and 9, a solid portion of the optical refractive layers 500 extends across the transmission areas TA to connect two planar area portions having minute holes MH defined therein to each other.

The optical refractive layers 500 may have the minute holes MH. The minute holes MH are arranged in a planar area to correspond to the pixel areas PA. Some of the minute holes MH may overlap the transmission areas TA, such as adjacent to the boundary thereof.

Referring to FIG. 8, a same optical refractive layer 500 may continuously extend along the x-axis direction and/or the y-axis direction to be commonly disposed corresponding to multiple groups of pixels PX, multiple transmission areas TA, etc. along a respective direction. However, the present disclosure is not limited thereto.

Figure 10:
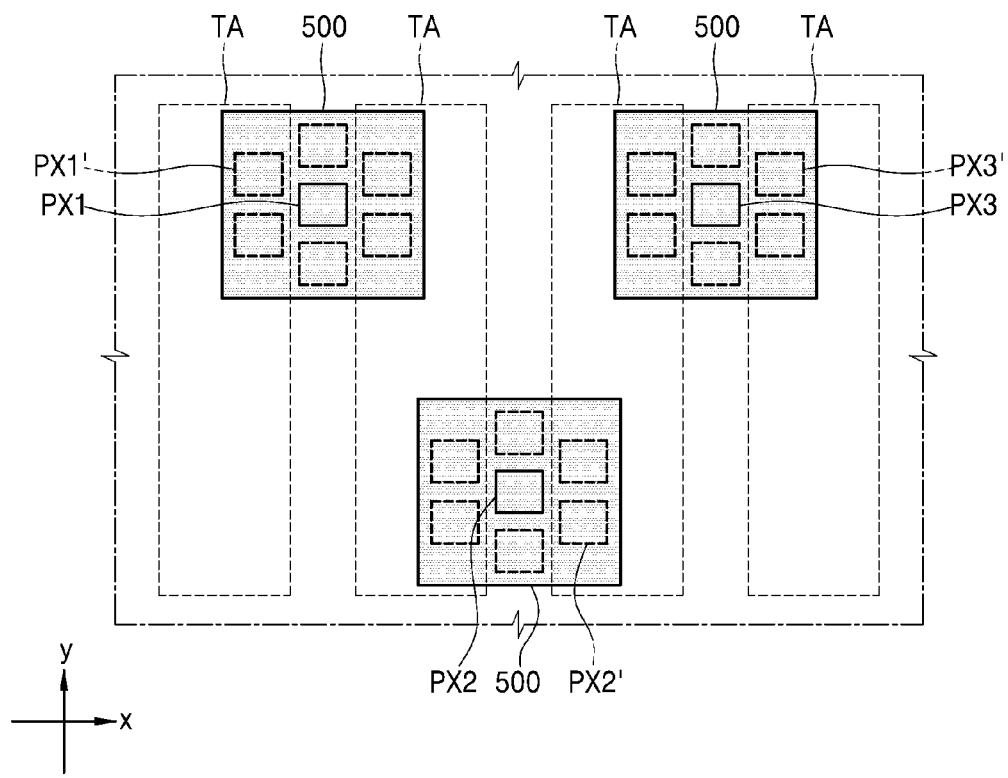
FIG. 10 is a top plan view of another embodiment of a portion corresponding to a pixel and a periphery of the pixel of a display apparatus.

FIG. 10 is a top plan view of another embodiment of a portion corresponding to a pixel and a periphery of the pixel of a display apparatus.

FIG. 10 illustrates that the display apparatus has a structure in which first, second, and third pixels PX1, PX2, and PX3 are arranged in a pentile-type arrangement. The first, second, and third pixels PX1, PX2, and PX3 may each emit light of different colors. The first, second, and third pixels PX1, PX2, and PX3 may, for example, emit light of a color corresponding to one of red, green, blue, and white.

Referring to FIG. 10, the first, second, and third pixels PX1, PX2, and PX3 are arranged to cross each other, and transmission areas TA1, TA2, TA3, and TA4 are arranged between the first, second, and third pixels PX1, PX2, and PX3, respectively. For example, when the first pixel PX1 emits red light, the second pixel PX2 emits green light, and the third pixel PX3 emits blue light, the first pixel PX1 is arranged between the first and second transmission areas TA1 and TA2, the second pixel PX2 is arranged between the second and third transmission areas TA2 and TA3, and the third pixel PX3 is arranged between the third and fourth transmission areas TA3 and TA4.

The optical refractive layers 500 as discrete patterns are arranged on the first, second, and third pixels PX1, PX2, and PX3, respectively. Although not illustrated, like the embodiments described above, the optical refractive layers 500 may be arranged on an upper substrate 400. As another embodiment, the optical refractive layers 500 may be arranged over the whole surface of the display area DA including the first, second, and third pixels PX1, PX2, and PX3, such as being continuous along both the x-axis and y-axis directions instead of being the discrete patterns.

The optical refractive layers 500 may include the minute holes MH. When light is emitted from each of the first, second, and third pixels PX1, PX2, and PX3, the light is diffracted via the minute holes MH. Thus, as shown in FIG. 10, first, second, or third replicated pixels PX1', PX2', or PX3' may appear in plurality at a periphery of the first, second, or third pixels PX1, PX2, or PX3, respectively. In the present embodiment, six replicated first, second, or third pixels PX1', PX2', or PX3' may appear at the periphery of the first, second, or third pixels PX1, PX2, or PX3, respectively. In a top plan view, the replicated first, second, or third pixels PX1', PX2', or PX3' may be arranged above, below, to the left, and to the right relative to the first, second, or third pixels PX1, PX2, and PX3, respectively. A form of the replicated first, second, or third pixels PX1', PX2', and PX3' relative to the first, second, or third pixels PX1, PX2, and PX3, respectively, may be implemented by changing a design of the minute holes MH.

As described above, a structure in which the minute holes MH are arranged is designed to form the replicated first, second, and third pixels PX1', PX2', and PX3' by diffracting light when the light is actually emitted from the first, second, and third pixels PX1, PX2, and PX3. The first, second, and third replicated pixels PX1', PX2', and PX3' may appear at a periphery of the first, second, and third pixels PX1, PX2, and PX3, respectively, to expand a planar area at which light is visible (e.g., light-emitting area EA) as compared to a planar area to which emitted light actually extends (e.g., pixel area PA).

The optical refractive layers 500 may be arranged so that a portion of the optical refractive layers 500 overlap the transmission areas TA. As shown in FIG. 10, some of the replicated first, second, and third pixels PX1', PX2', and PX3' may fully appear in the transmission areas TA, while others may fully appear in the pixel areas PA (e.g., between boundaries of adjacent transmission areas TA).

In the display apparatus of the present embodiment, portions of the optical refractive layers 500 may be arranged to overlap the transmission areas TA, and the replicated first, second, and third pixels PX1', PX2', and PX3' may appear in overlapping areas in which portions of the optical refractive layers 500 overlap the transmission areas TA. Thus, the display apparatus may be implemented so that planar areas at which light is visible in the form of the replicated first, second, and third pixels PX1', PX2', and PX3' is larger than planar areas to which light actually emitted from the first, second, and third pixels PX1, PX2, and PX3 extends. That is, even though planar areas in which light may be actually emitted or to which emitted light extends are planar areas corresponding to the pixels PX, as light diffracted via the optical refractive layers 500 is visible as the replicated first, second, and third pixels PX1', PX2', and PX3', planar areas in which light is visible may be extended to the planar areas in which the replicated first, second, and third pixels PX1', PX2', and PX3' are implemented.

Figure 11:
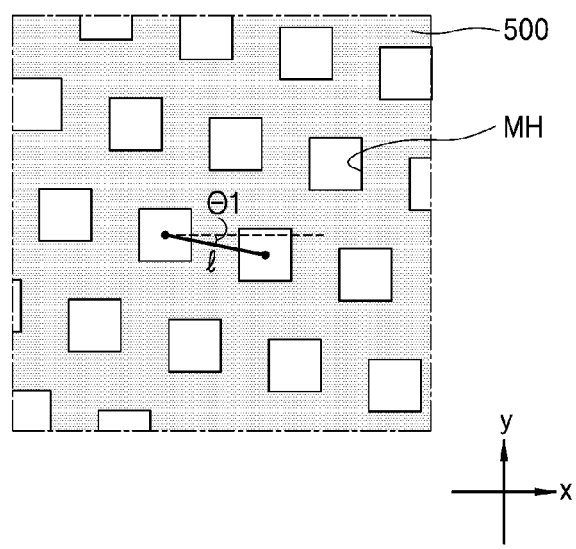
FIGS. 11 and 12 are enlarged top plan views of another embodiment of region A and a portion thereof, corresponding to a pixel and a periphery of the pixel of the display apparatus of FIG. 10.
Figure 12:
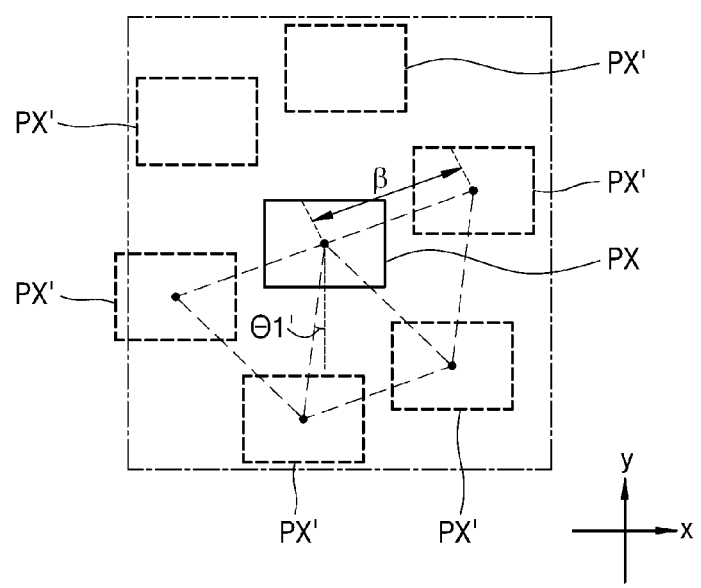

FIGS. 11 and 12 are enlarged top plan views of another embodiment of region A and a portion thereof, corresponding to a pixel and a periphery of the pixel of the display apparatus of FIG. 10.

In an embodiment described with reference to FIGS. 10 to 12, a hexagonal-type arrangement in which a total of six replicated pixels PX' are implemented respectively at the upper, the upper left, the upper right, the lower, the lower left, and the lower right positions along a diagonal direction with reference to a pixel PX is shown. The distance β between a pixel PX and a replicated pixel PX' in the hexagonal-type arrangement may satisfy Equation 2 below. A pitch between pixels PX which actually emit light is 'Pitch' in Equation 2.

$$\beta = \frac{\text{Pitch}}{3\cos(30° - 10.89°) - \sin(10.89°)} \quad \text{Equation 2}$$

The period α between the minute holes MH may satisfy Equation 3 below. Period is represented by l in FIG. 12.

$$a = \frac{2}{\sqrt{3}} \times \frac{\lambda}{n_{EN}} \times \frac{1}{\sin\left(\tan^{-1}\frac{\beta}{Z_{EN}}\right)} \quad \text{Equation 3}$$

Based on Equation 2 and Equation 3 above, for example, when the distance β between a pixel PX which actually emits light and a replicated pixel PX' corresponding to the pixel PX is about 24.66 μm, the period α between minute holes MH may be designed at about 5.8 μm.

In addition, referring to FIG. 11, the minute holes MH may be arranged along a diagonal line which forms a predetermined angle θ1 with reference to the x-axis direction. According to such an arrangement of the minute holes MH, the replicated pixels PX' a hexagonal-type arrangement are implemented to be arranged along a diagonal line which forms a predetermined angle θ1' with reference to the y-axis direction. In an embodiment, for example, the predetermined angles θ1 and θ1' may be about 10° to about 20°.

Based on one or more embodiment, a display apparatus includes a structure in which planar areas corresponding to the pixels PX which actually emit light are greatly reduced and same light-emitting efficiency is obtained, as compared to that of a conventional display apparatus. Thus, a size of the transmission areas TA is enlarged compared to that of the conventional display apparatus to thereby enhance the transmissibility of the display apparatus as a transparent display apparatus.

Embodiments of structure of a display apparatus have been mainly described. However, the present disclosure is not limited thereto. It will be understood that a method of manufacturing a display apparatus having one or more of the above-described structures is also included in the scope of the present disclosure.

As described above, according to one or more embodiment, a display apparatus in which sufficient transmittance is ensured and image display resolution is enhanced may be implemented. However, the scope of the present disclosure is not limited to such an effect.

It should be understood that embodiments described herein should be considered in a descriptive sense only and not for purposes of limitation. Descriptions of features or features within each embodiment should typically be considered as available for other similar features or features in other embodiments.

While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
    a transmission area at which an image of a background behind the display apparatus is visible from a front side thereof;
    a pixel area at which light is emitted to display an image of the display apparatus;
    a display unit in the pixel area,
    the display unit in the pixel area comprising:
        a light-emitting device which emits the light, and
        a pixel circuit which is electrically connected to the light-emitting device and controls the light-emitting device to emit the light; and
    an optical refractive layer through which both the image of the background and the light which is emitted from the pixel area are transmitted to outside the display apparatus,
    wherein the optical refractive layer defines a plurality of minute holes in planar areas of the pixel area respectively corresponding to the light-emitting device and to a periphery of the light-emitting device.

2. The display apparatus of claim 1, wherein
    the transmission area is adjacent to the pixel area along a first direction, and
    in the planar areas of the pixel area, the plurality of minute holes of the optical refractive layer are arranged along a diagonal line inclined relative to the first direction.

3. The display apparatus of claim 1, wherein the optical refractive layer comprises silicon oxide.

4. The display apparatus of claim 1, wherein no light-emitting device is in the transmission area.

5. The display apparatus of claim 1, wherein the plurality of minute holes of the optical refractive layer are arranged to have a constant pitch in one direction along the planar areas of the pixel area.

6. The display apparatus of claim 1, wherein the optical refractive layer further defines the plurality of minute holes corresponding to the transmission area.

7. The display apparatus of claim 1, wherein
    the display unit which is supplied with power displays the image of the display apparatus in a planar area of the pixel area which corresponds to the light-emitting device, and
    the plurality of minute holes of the optical refractive layer replicates the image of the display apparatus which is displayed at the planar area which corresponds to the light-emitting device, to define a replicated image, the replicated image being displayed at a planar area of the pixel area which corresponds to the periphery of the light-emitting device.

8. The display apparatus of claim 1, further comprising a lower substrate and an upper substrate facing each other with the display unit therebetween,
wherein the upper substrate is disposed between the display unit and the optical refractive layer.

9. The display apparatus of claim 1, wherein the optical refractive layer further defines a solid portion thereof in which no minute holes are defined, at the transmission area.

10. A display apparatus comprising:
a plurality of pixels at which light is emitted to display an image of the display apparatus;
a plurality of transmission areas at which an image of a background behind the display apparatus is visible from a front side thereof, the plurality of transmission areas alternating with the plurality of pixels at which light is emitted;
a display unit in each of the plurality of pixels at which light is emitted, the display unit comprising:
a light-emitting device which emits the light, and
a pixel circuit which is electrically connected to the light-emitting device and controls the light-emitting device to emit the light; and
an optical refractive layer through which the light which is emitted from the plurality of pixels at which light is emitted is transmitted to outside the display apparatus to display the image of the display apparatus,
wherein the optical refractive layer defines a plurality of minute holes in planar areas corresponding to each of the plurality of pixels at which light is emitted and peripheries of the plurality of pixels at which light is emitted.

11. The display apparatus of claim 10, wherein
the plurality of pixels at which light is emitted are arranged in a first direction or in a second direction which crosses the first direction, and
the plurality of minute holes of the optical refractive layer are arranged in a diagonal direction crossing each of the first direction and the second direction.

12. The display apparatus of claim 10, wherein the optical refractive layer comprises silicon oxide.

13. The display apparatus of claim 10, wherein no light-emitting device is disposed in any of the plurality of transmission areas.

14. The display apparatus of claim 10, wherein
the plurality of pixels at which light is emitted are arranged in a first direction or in a second direction which crosses the first direction, and
the plurality of minute holes of the optical refractive layer are arranged to have a constant pitch in the first direction or the second direction.

15. The display apparatus of claim 10, wherein the optical refractive layer further defines a plurality of minute holes in the transmission areas.

16. The display apparatus of claim 10, wherein
the display unit which is supplied with power displays the image of the display apparatus at the plurality of pixels at which light is emitted, and
the plurality of minute holes of the optical refractive layer replicates the image of the display apparatus which is displayed at the plurality of pixels at which light is emitted, to define a replicated image, the replicated image being displayed at the peripheries of the plurality of pixels at which light is emitted.

17. The display apparatus of claim 10, wherein the optical refractive layer extends from a planar area corresponding to respective peripheries of the plurality of pixels at which light is emitted, to further define at each of the transmission areas, a solid portion of the optical refractive layer in which no minute holes are defined.

18. The display apparatus of claim 10, further comprising a lower substrate and an upper substrate facing each other with the display unit therebetween,
wherein the upper substrate is disposed between the display unit and the optical refractive layer.

19. The display apparatus of claim 10, wherein
the plurality of transmission areas at which the image of the background behind the display apparatus is visible from the front side thereof alternate with the plurality of pixels at which light is emitted along a first direction,
the plurality of pixels at which light is emitted comprises groups of pixels respectively in which pixels are arranged along a second direction crossing the first direction, and
the optical refractive layer comprises a plurality of discrete patterns respectively corresponding to a group of pixels among the groups of pixels, the plurality of discrete patterns spaced apart from each other along the first direction.

20. The display apparatus of claim 19, wherein the plurality of discrete patterns are spaced apart from each other along the first direction and the second direction.

* * * * *